(12) United States Patent
Chen et al.

(10) Patent No.: US 11,798,945 B2
(45) Date of Patent: Oct. 24, 2023

(54) SEMICONDUCTOR STRUCTURE

(71) Applicant: TAIWAN SEMICONDUCTOR MANUFACTURING COMPANY, LTD., Hsinchu (TW)

(72) Inventors: Winnie Victoria Wei-Ning Chen, Zhubei (TW); Meng-Hsuan Hsiao, Hsinchu (TW); Tung-Ying Lee, Hsinchu (TW); Pang-Yen Tsai, Jhu-bei (TW); Yasutoshi Okuno, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/846,543

(22) Filed: Jun. 22, 2022

(65) Prior Publication Data

US 2022/0328480 A1    Oct. 13, 2022

Related U.S. Application Data

(60) Continuation of application No. 17/140,289, filed on Jan. 4, 2021, which is a continuation of application
(Continued)

(51) Int. Cl.
*H01L 27/092* (2006.01)
*H01L 29/423* (2006.01)
(Continued)

(52) U.S. Cl.
CPC ...... *H01L 27/092* (2013.01); *H01L 21/02636* (2013.01); *H01L 21/30625* (2013.01);
(Continued)

(58) Field of Classification Search
CPC ......... H01L 21/02603; H01L 21/02636; H01L 21/30625; H01L 21/823807;
(Continued)

(56) References Cited

U.S. PATENT DOCUMENTS 9,209,247 B2   12/2015 Colinge et al.
9,236,267 B2   1/2016  De et al.
(Continued)

OTHER PUBLICATIONS

U.S. Notice of Allowance for U.S. Appl. No. 16/809,046, dated Aug. 21, 2020.
(Continued)

*Primary Examiner* — David C Spalla
(74) *Attorney, Agent, or Firm* — Birch, Stewart, Kolasch & Birch, LLP

(57) ABSTRACT

A semiconductor device is provided. The semiconductor device includes a substrate and a semiconductor layer formed over the substrate. The semiconductor device further includes a first channel layer and a second channel layer and a first insulating structure interposing the first channel layer and the semiconductor layer and a second insulating structure interposing the first channel layer and the second channel layer. The semiconductor device further includes a gate stack abutting the first channel layer and the second channel layer, and the gate stack includes a first portion vertically sandwiched between the first channel layer and the semiconductor layer and a second portion vertically sandwiched between the first channel layer and the second channel layer.

20 Claims, 9 Drawing Sheets

Related U.S. Application Data

No. 16/910,297, filed on Jun. 24, 2020, now Pat. No. 10,886,270, which is a division of application No. 15/963,920, filed on Apr. 26, 2018, now Pat. No. 10,700,066.

(60) Provisional application No. 62/593,143, filed on Nov. 30, 2017.

(51) Int. Cl.
| | | |
|---|---|---|
| *H01L 29/06* | (2006.01) | |
| *H01L 21/306* | (2006.01) | |
| *H01L 29/16* | (2006.01) | |
| *H01L 21/02* | (2006.01) | |
| *H01L 29/10* | (2006.01) | |
| *H01L 21/8238* | (2006.01) | |

(52) U.S. Cl.
CPC .. *H01L 21/823807* (2013.01); *H01L 29/0673* (2013.01); *H01L 29/0676* (2013.01); *H01L 29/1033* (2013.01); *H01L 29/16* (2013.01); *H01L 29/42392* (2013.01)

(58) Field of Classification Search
CPC ..... H01L 21/823431; H01L 21/823821; H01L 21/845; H01L 27/0886; H01L 27/092; H01L 27/0924; H01L 27/10879; H01L 27/1211; H01L 29/0665; H01L 29/0669; H01L 29/0673; H01L 29/0676; H01L 29/1033; H01L 29/16; H01L 29/41791; H01L 29/42392; H01L 29/66439; H01L 29/66795; H01L 29/6681; H01L 29/775; H01L 29/785; H01L 29/7851; H01L 29/7853; H01L 29/7855; H01L 2029/7858
See application file for complete search history.

(56) References Cited

U.S. PATENT DOCUMENTS

| | | | |
|---|---|---|---|
| 9,312,186 B1 | 4/2016 | Su et al. | |
| 9,412,817 B2 | 8/2016 | Yang et al. | |
| 9,412,828 B2 | 8/2016 | Ching et al. | |
| 9,425,291 B1* | 8/2016 | Balakrishnan | H01L 29/66469 |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,755,017 B1* | 9/2017 | Guillorn | H01L 27/1211 |
| 9,991,352 B1* | 6/2018 | Frougier | H01L 29/42364 |
| 2013/0270512 A1 | 10/2013 | Radosavljevic et al. | |
| 2014/0091360 A1 | 4/2014 | Pillarisetty et al. | |
| 2014/0225065 A1 | 8/2014 | Rachmady et al. | |
| 2017/0018462 A1 | 1/2017 | Suk et al. | |
| 2018/0053690 A1 | 2/2018 | Wang et al. | |
| 2018/0090624 A1* | 3/2018 | Cheng | H01L 29/78687 |
| 2018/0122899 A1* | 5/2018 | Guillorn | H01L 29/66772 |
| 2018/0218938 A1 | 8/2018 | Schultz | |
| 2019/0164965 A1 | 5/2019 | Chen et al. | |
| 2019/0326290 A1 | 10/2019 | Cea et al. | |

OTHER PUBLICATIONS

U.S. Office Action for U.S. Appl. No. 17/140,289 dated Aug. 3, 2022.

* cited by examiner

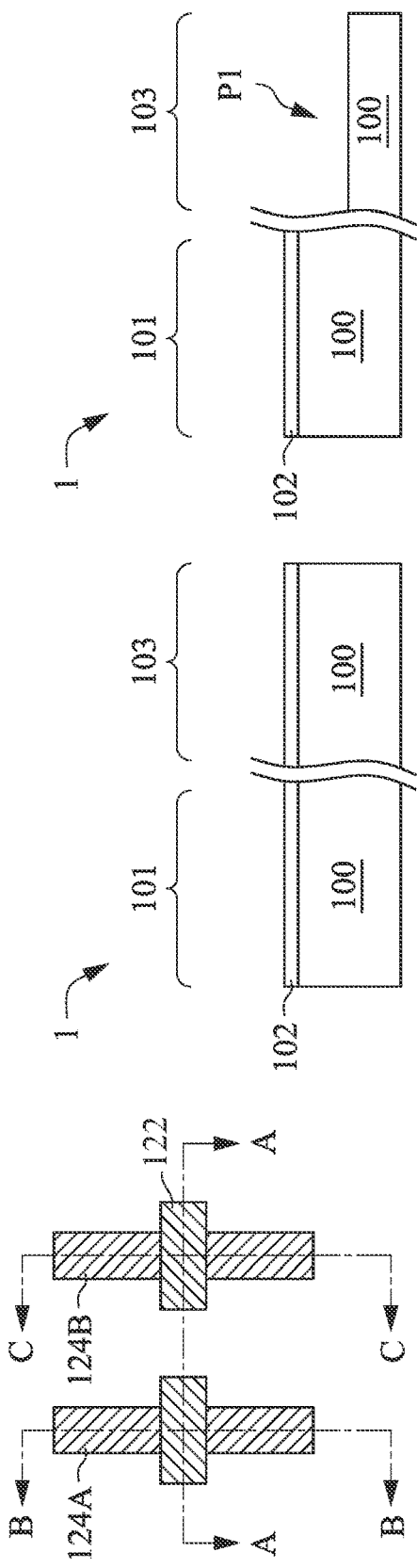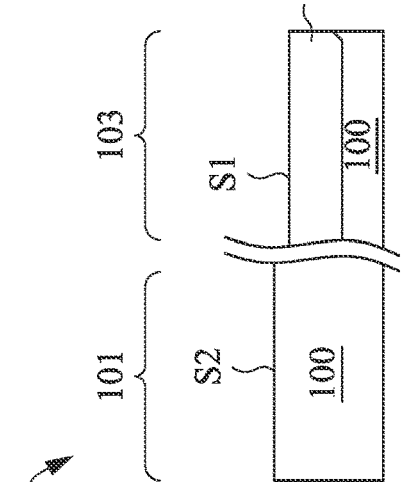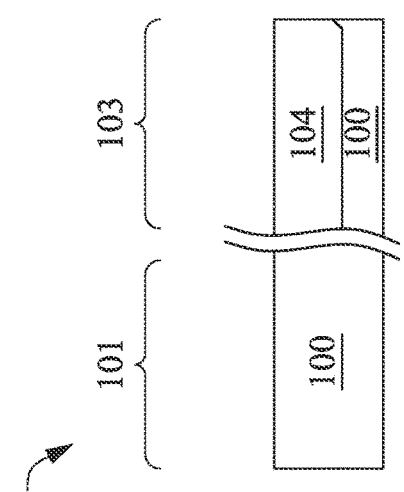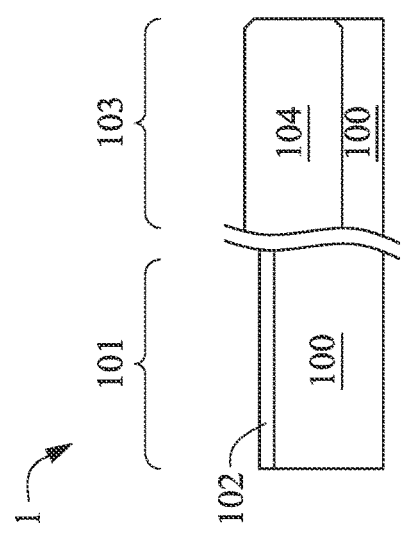

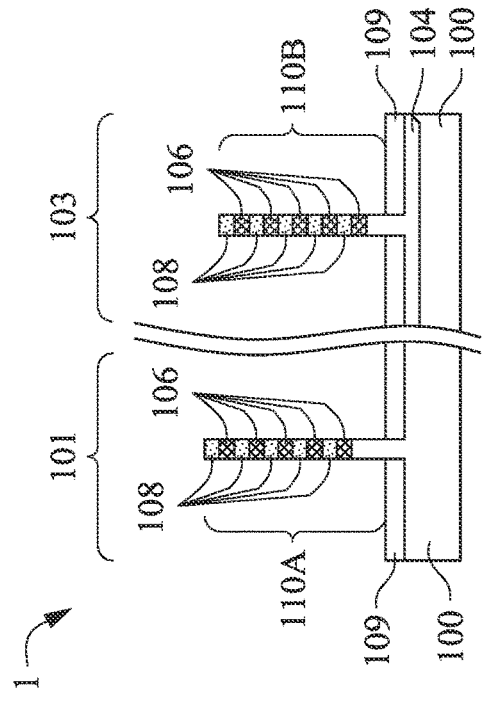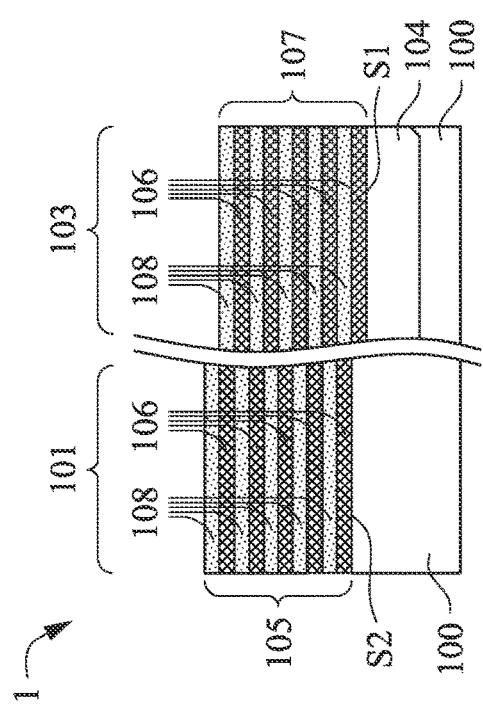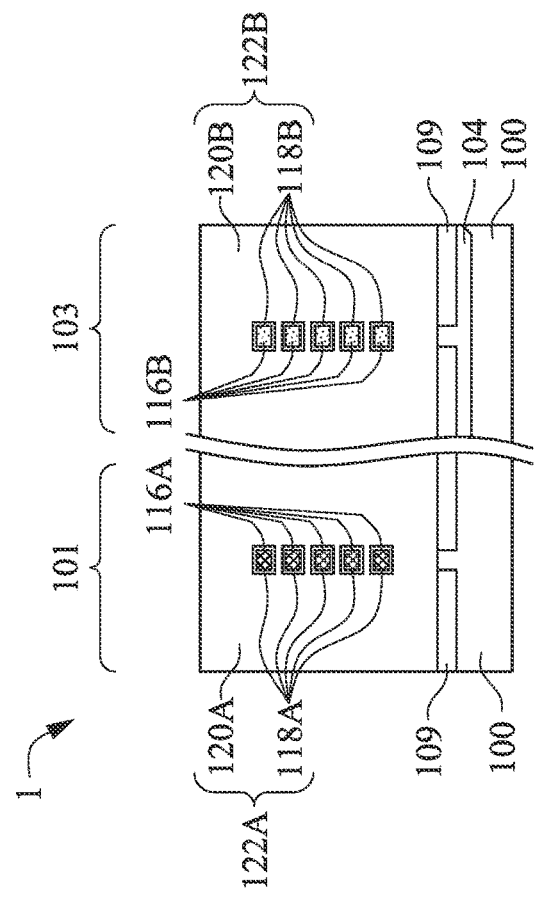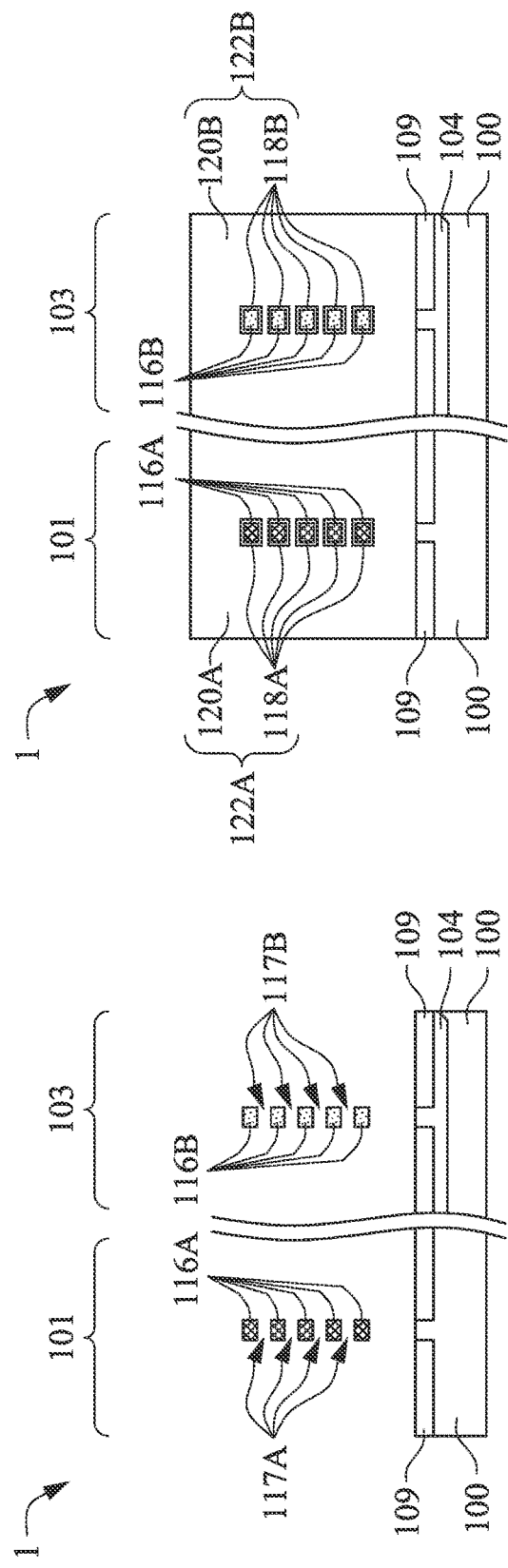

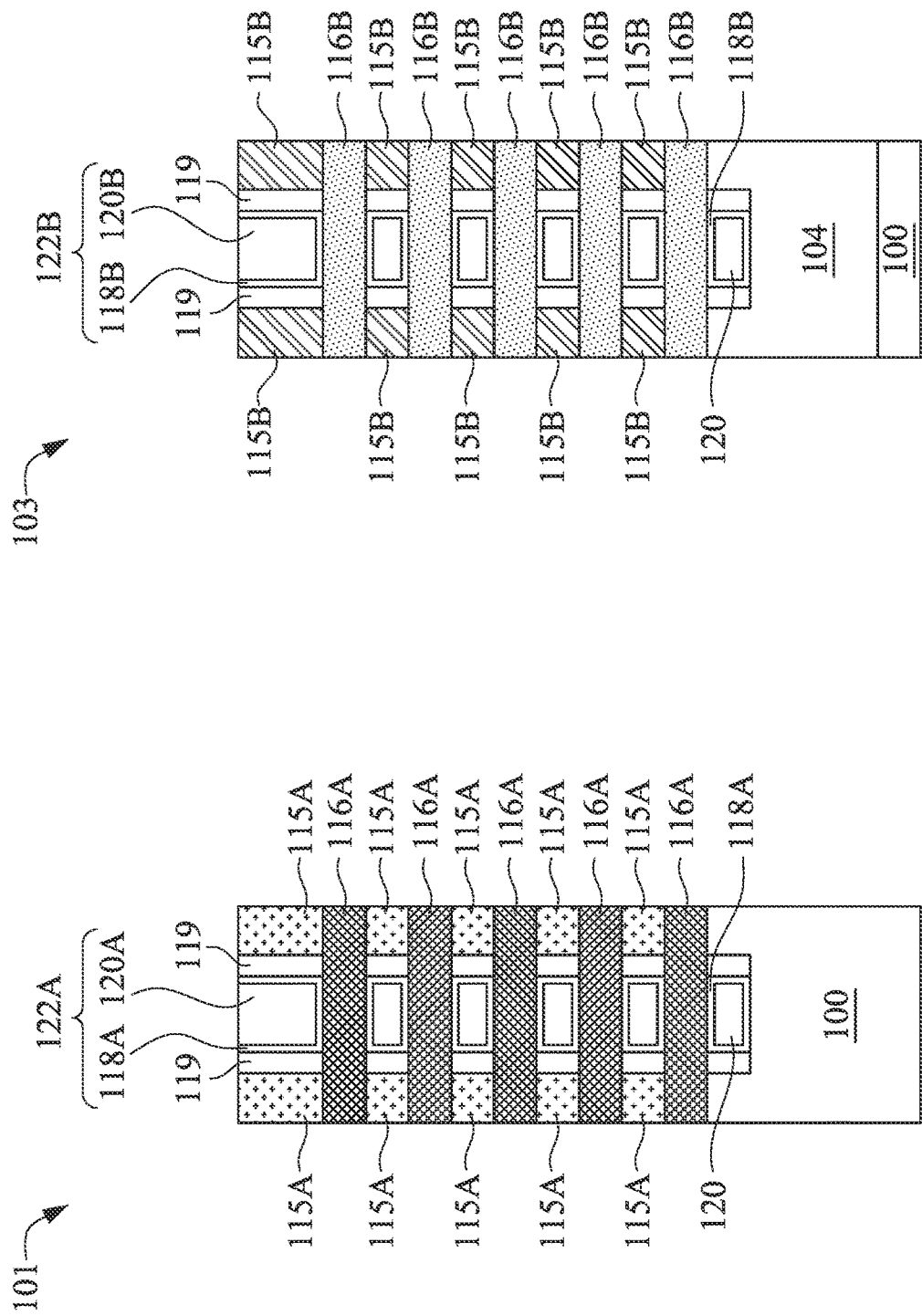

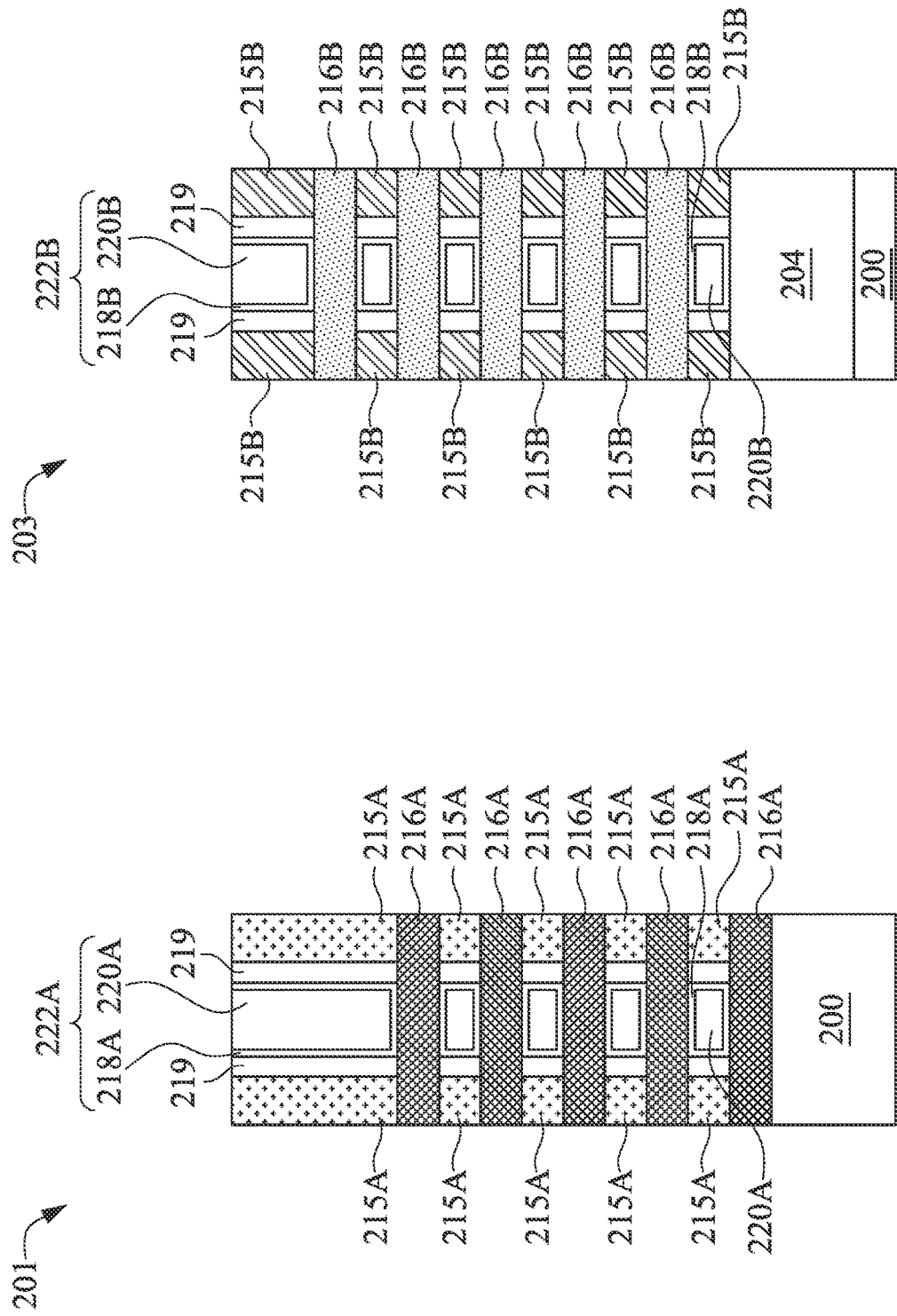

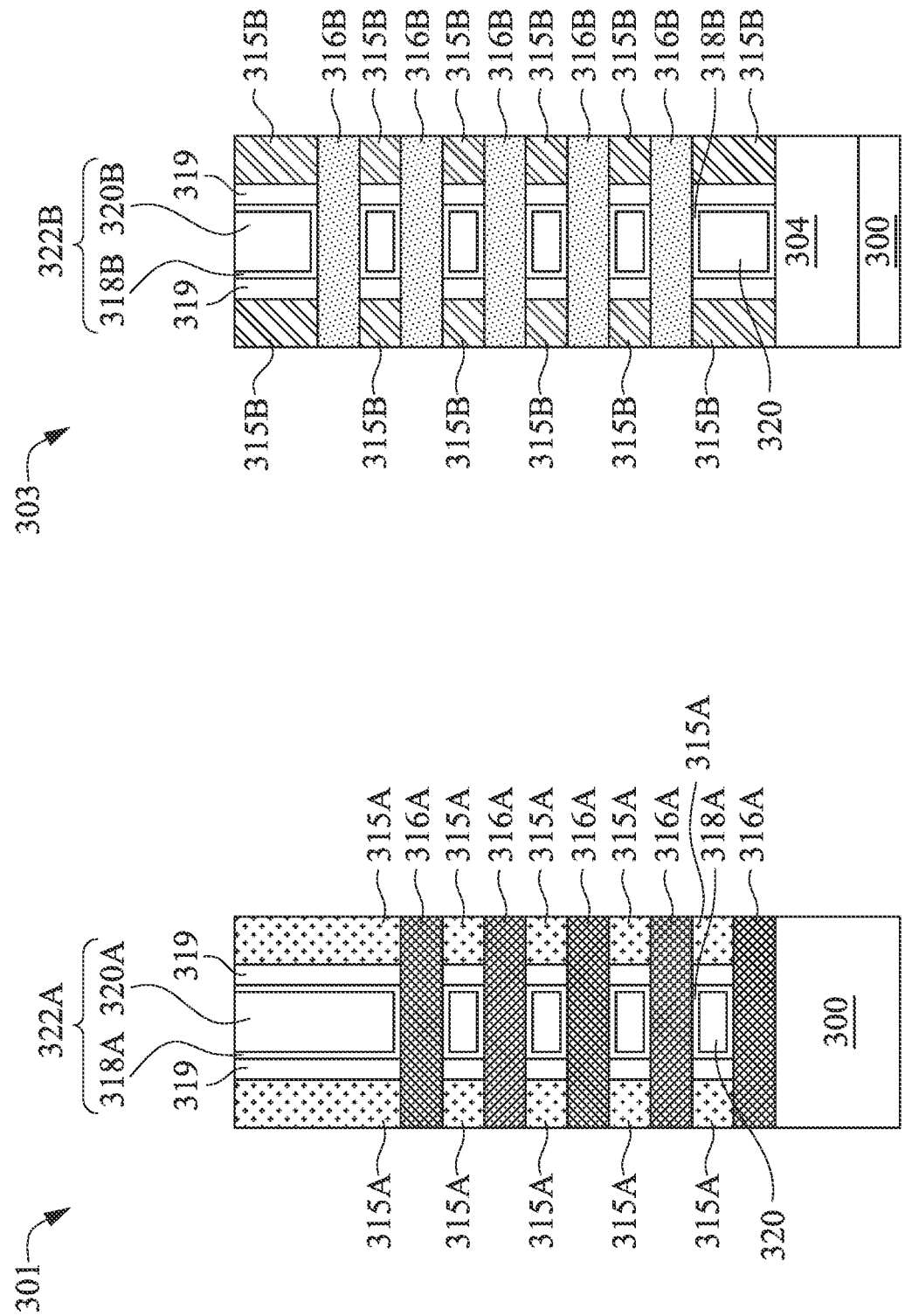

SEMICONDUCTOR STRUCTURE

RELATED APPLICATIONS

This application is a Continuation Application of U.S. patent application Ser. No. 17/140,289, filed on Jan. 4, 2021, which is a Continuation Application of U.S. patent application Ser. No. 16/910,297, filed on Jun. 24, 2020, which is a Divisional Application of U.S. application Ser. No. 15/963,920, filed on Apr. 26, 2018, which claims priority to U.S. Provisional Application Ser. No. 62/593,143, filed Nov. 30, 2017, the entirety of which are incorporated by reference herein.

BACKGROUND

Transistors are components of modern integrated circuits. To satisfy the trend of increasingly faster speed, the drive currents of transistors need to be increasingly greater. To achieve this increase in performance, the gate lengths of transistors are scaled down. Scaling down the gate lengths leads to undesirable effects known as "short-channel effects," in which the control of current flow by the gates is compromised. Among the short-channel effects are the Drain-Induced Barrier Lowering (DIBL) and the degradation of sub-threshold slope, both of which result in the degradation in the performance of transistors.

For example, multi-gate devices have been introduced in an effort to improve gate control by increasing gate-channel coupling, reduce OFF-state current, and reduce short-channel effects (SCEs). One such multi-gate device is horizontal gate-all-around (HGAA) transistor, whose gate structure extends around its horizontal channel region providing access to the channel region on all sides or three sides. The HGAA transistors are compatible with complementary metal-oxide-semiconductor (CMOS) processes, allowing them to be aggressively scaled down while maintaining gate control and mitigating SCEs. However, fabrication of the HGAA transistors can be challenging. For example, nanowire formation of HGAA transistors by the current methods is not satisfactory in all respects, especially when using a single process, such as a single epitaxial process.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

FIG. 1 is a plan view of some embodiments of a GAA FET device according to the present disclosure.

FIGS. 2-10 are cross-sectional views corresponding to line A-A of FIG. 1 and show a sequential process for manufacturing a GAA FET device according to some embodiments of the present disclosure.

FIG. 11 is a cross-sectional view corresponding to line B-B of FIG. 1 and shows a sequential process for manufacturing a GAA FET device according to some embodiments of the present disclosure.

FIG. 12 is a cross-sectional view corresponding to line C-C of FIG. 1 and shows a sequential process for manufacturing a GAA FET device according to some embodiments of the present disclosure.

FIG. 23 is a cross-sectional view corresponding to line B-B of FIG. 13 and shows a sequential process for manufacturing a GAA FET device according to some embodiments of the present disclosure.

FIG. 24 is a cross-sectional view corresponding to line C-C of FIG. 13 and shows a sequential process for manufacturing a GAA FET device according to some embodiments of the present disclosure

FIG. 34 is a cross-sectional view corresponding to line B-B of FIG. 25 and shows a sequential process for manufacturing a GAA FET device according to some embodiments of the present disclosure.

FIG. 35 is a cross-sectional view corresponding to line C-C of FIG. 25 and shows a sequential process for manufacturing a GAA FET device according to some embodiments of the present disclosure.

DETAILED DESCRIPTION

Figure 15:
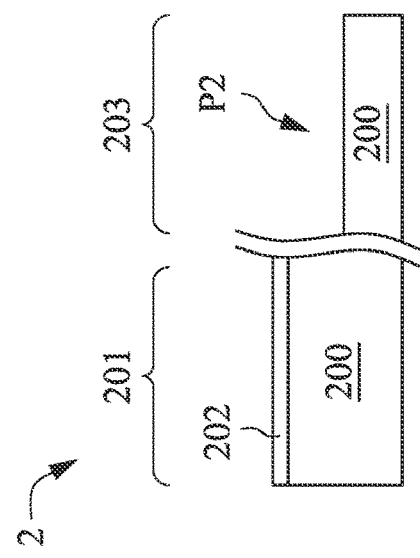
FIGS. 14-22 are cross-sectional views corresponding to line A-A of FIG. 13 and show a sequential process for manufacturing a GAA FET device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

It is also noted that the present disclosure presents embodiments in the form of methods of forming semiconductor devices. For example, embodiments of the present disclosure may be used to form multi-gate transistors such as FinFET devices, gate-all-around (GAA) devices, Omega-gate (a-gate) devices, or Pi-gate (H-gate) devices, as well as strained-semiconductor devices, silicon-on-insulator (SOI) devices, partially-depleted SOI devices, fully-depleted SOI devices. In addition, embodiments disclosed herein may be employed in the formation of P-type and/or N-type devices. One of ordinary skill may recognize other embodiments of semiconductor devices that may benefit from aspects of the present disclosure.

FIG. 1 is a plan view of some embodiments of a GAA FET device according to the present disclosure. FIGS. 2-12 show exemplary sequential processes for manufacturing GAA FET devices according to embodiments of the present disclosure. It is understood that additional operations can be provided before, during, and after processes shown by FIGS. 2-12, and some of the operations described below can be replaced or eliminated, for certain embodiments of the method. The order of the operations/processes may be interchangeable.

A plan view of a GAA FET device is illustrated in FIG. 1. As shown in FIG. 1, gate stacks 122 are formed overlying first and second nanowire structures 124A and 124B, each of which includes one or more nanowires. Although two nanowire structures and two gate stacks are shown in FIG. 1, GAA FET devices according to the present disclosure may include one, three, or more nanowire structures and one, three, or more gate stacks.

Referring to FIG. 2, a device 1 comprising a substrate 100 is provided. The substrate 100 may be a semiconductor substrate, which may be, for example, a silicon substrate, a silicon germanium substrate, or a substrate formed of other semiconductor materials. In some embodiments, the substrate 100 is a bulk substrate. Alternatively, the substrate 100 may be a semiconductor-on-insulator (SOI) substrate. Hard mask 102 is formed over the substrate 100. In accordance with some embodiments of the present disclosure, the hard mask 102 is formed of silicon oxide, silicon nitride, silicon oxynitride, silicon carbide, silicon carbo-nitride, the like, or combinations thereof.

As shown in FIG. 2, the substrate 100 comprises a P-type field effect transistor (PFET) region 101 and an N-type field effect transistor (NFET) region 103. Next, as shown in FIG. 3, the hard mask 102 and the substrate 100 are patterned and etched to form a recess P1 over the NFET region 103. Therefore, a top surface of the NFET region 103 is lower than that of the PFET region 101. In some embodiments, a silicon germanium (SiGe) layer 104 is then formed on the substrate 100 in the NFET region 103 to fill the recess P1, as shown in FIG. 4. In other embodiments, the layer 104 may be made of other semiconductor materials. The silicon germanium layer 104 is different from the material of the substrate 100. For example, the substrate 100 is formed of silicon, rather than silicon germanium. The formation of the SiGe layer 104 may be performed by a molecular beam epitaxy (MBE) process, a metalorganic chemical vapor deposition (MOCVD) process, and/or other suitable growth processes.

After the formation of the SiGe layer 104, a planarization operation, such as a chemical mechanical planarization (CMP) operation, may be performed to the substrate 100, thinning down the SiGe layer 104 overlying the substrate 100 in the NFET region 103. The resulting structure is illustrated in FIG. 5. A top surface of the SiGe layer 104 is substantially level with a top surface of the substrate 100 in the PFET region 101.

After the planarization operation performed to the SiGe layer 104, an etch-back operation is performed to recess the SiGe layer 104, thereby forming a lowered top surface S1 in lower elevation than the top surface S2 of the substrate 100 in the PFET region 101. The resulting structure is shown in FIG. 6. The recessing process may include a dry etching process, a wet etching process, and/or a combination thereof. Conditions of the recessing process are selected to form such surfaces S1 and S2 as shown in FIG. 6. For example, the etch-back operation may be a plasma process using $CF_4$, $CF_2Cl_2$, $CF_3Br$, HBr, chlorine as process gases and an inert gas, such as He, Ne, Ar, Kr, Xe and Rn and combinations thereof as a carrier gas, to anisotropically etch the SiGe layer 104. In some embodiments, the etch-back operation comprises adoping an etchant having a selectivity between Si and SiGe. In some embodiments, the process conditions include a temperature of below about 200° C., a pressure from about 0 torr to about 10 torr, and an RF power of from about 50 W to about 2000 W. In other embodiments, the process conditions include a temperature of below about 60° C., a pressure of from about 0 torr to about 500 mtorr, and an RF power from about 50 W to about 300 W. In some embodiments, the etch-back may be performed using first standard cleaning (SC1), second standard cleaning (SC2) and etching gases, which may be HCl. An exemplary SC1 employs a cleaning solution, such as ammonia hydroxide-hydrogen peroxide-water mixture, which is applied at temperature from about 20° C. to about 100° C. and under pressure about 1 torr. An exemplary SC2 employs another cleaning solution, such as hydrochloric acid-hydrogen peroxide-water mixture, which is applied at temperature from about 20° C. to about 100° C. and under pressure about 1 torr. While using HCl as etching gases to perform the etch-back, the flow rate of HCl is from about 100 sccm to about 30000 sccm. The etch-back temperature is from about 500° C. to about 600° C. The pressure is from about 10 torr to about 100 torr.

Referring to FIG. 6, in some embodiments, a recessing depth of the SiGe layer 104 is controlled (e.g., by controlling an etching duration) so as to result in a desired height difference between the top surface S1 of the remaining SiGe layer 104 and the top surface S2 of the substrate 100 in the PFET region 101. The height difference between the top surfaces S1 and S2 may be adjusted based on heights of nanowires subsequently formed in the PFET region 101 and the NFET region 103. In some embodiments, the height difference between the top surfaces S1 and S2 ranges from about 4 nm to about 10 nm. Such a height difference contributes to alignment of subsequently formed Si nanowires in the NFET region 103 with SiGe nanowires in the PFET region 101.

A stack including semiconductor layers are formed over the substrate. For example, referring to FIG. 7, a first stack 105 and a second stack 107 of semiconductor layers are formed over the substrate 100 in the PFET region 101 and the NFET region 103 respectively. The first stack 105 and second stack 107 of semiconductor layers may include alternating layers of different compositions. For example, in some embodiments, the first and second stacks 105 and 107 include first semiconductor layers 106 of a first composition alternating with second semiconductor layers 108 of a second composition different from the first composition. Although five first semiconductor layers 106 and five second semiconductor layers 108 are shown, it is understood that the first and second stacks 105 and 107 may include any number of layers of any suitable composition with various examples including between 2 and 10 first semiconductor layers 106 and between 2 and 10 second semiconductor layers 108. As explained below, the different compositions of the layers in the first and second stacks 105 and 107 (e.g., first semiconductor layers 106 and second semiconductor layers 108) may be used to selectively process some of the layers. Accordingly, the compositions may have different oxidation rates, etchant sensitivity, and/or other differing properties.

In some embodiments, either of the semiconductor layers 106 and 108 may include silicon. In some embodiments, either of the semiconductor layers 106 and 108 may include other materials such as Ge, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In some embodiments, the semiconductor layer 106 may include from about 10% to about 70% Ge in molar ratio and the semiconductor layer 108 may include Si. In other embodiments, the semiconductor layer 106 may include Si and the semiconductor layer 108 may include from about 10% to about 70% Ge in molar ratio. In some embodiments, the semiconductor layers 106 and 108 may be undoped or substantially dopant-free (i.e., having an extrinsic dopant concentration from about 0 $cm^{-3}$ to about $1\times10^{17}$ $cm^{-3}$), where for example, no doping is performed during the epitaxial growth process. Alternatively, the semiconductor layers 108 may be doped. For example, the semiconductor layers 106 or 108 may be doped with a p-type dopant such as boron (B), aluminum (Al), indium (In), and gallium (Ga) for forming a p-type channel, or an n-type dopant such as phosphorus (P), arsenic (As), antimony (Sb), for forming an n-type channel. In the depicted embodiments, the first semiconductor layers 106 are SiGe layers, and the second semiconductor layer 108 are Si layers.

The thickness of first and second semiconductor layers 106 and 108 are determined based on the height difference between the top surfaces S1 and S2. For example, the thickness of either the first semiconductor layer 106 or the second semiconductor layer 108 is substantially equal to the height difference between the top surfaces S1 and S2. By way of example, the thickness of the first semiconductor layer 106 is in a range from about 4 nm to about 10 nm. In some embodiments, the first semiconductor layers 106 of the first and second stacks 105 and 107 may be substantially uniform in thickness. In some embodiments, the thickness of the semiconductor layer 108 is in a range from about 4 nm to about 10 nm. In some embodiments, the second semiconductor layers 108 of the first and second stacks 105 and 107 are substantially uniform in thickness. By way of example, growth of the layers of the stacks 105 and 107 may be performed by a molecular beam epitaxy (MBE) process, a metalorganic chemical vapor deposition (MOCVD) process, and/or other suitable epitaxial growth processes. In some embodiments, the growth of the layers of the stacks 105 and 107 may be performed using process gases comprising $SiH_4$, DCS, $GeH_4$, $Si_2H_6$, $PH_3$, HCl, $GeH_4$ or MMS (carbon source) and carrier gas comprising $N_2$ or $H_2$. The epitaxial growth process may be performed under process temperature in a range from about 400° C. to about 800° C. and under process pressure below about 50 torr, as example.

Referring again to FIG. 7, the stacks 105 and 107 are grown using a single epitaxial process. In other words, the stacks 105 and 107 are epitaxially grown simultaneously over the PFET and NFET region 101 and 103. Since the height difference between the top surfaces S1 and S2 is equal to the thickness of either the first semiconductor layer 106 or the second semiconductor layer 108, a bottommost semiconductor layer 106 in the NFET region 103 has a top surface substantially level with the top surface S2 of the substrate 100 in the PFET region 101. Therefore, the first semiconductor layers 106 in the PFET region 101 are aligned with the respective semiconductor layers 108 in the NFET region 103. Meanwhile, the semiconductor layers 108 in the PFET region 101 are aligned with the respective semiconductor layers 106 in the NFET region 103.

In some embodiments, a bottommost semiconductor layer 106 overlying the substrate 100 in the PFET region 101 is at a height higher than a bottommost semiconductor layer 106 overlying the SiGe layer 104 in the NFET region 103, as shown in FIG. 7. Therefore, a top surface of the first stack 105 is at a height higher than a top surface of the second stack 107. In detail, a height difference between a top surface of the stack 105 and a top surface of the stack 107 is substantially equal to the height difference between the top surfaces S1 and S2. In other words, the semiconductor layer 108 overlying the substrate 100 in the PFET region 101 is at a height higher than the semiconductor layer 108 overlying the SiGe layer 104 in the NFET region 103.

Next, referring to FIG. 8, first and second fin elements 110A and 110B are formed over the PFET region 101 and the NFET region 103 using suitable processes including photolithography and etch processes. In some embodiments, a photoresist is formed over the first and second stacks 105 and 107 (as shown in FIG. 7) and patterned using a lithography process. The patterned photoresist may then be used to protect regions of the substrate 100 and the SiGe layer 104, and layers formed thereupon, while an etch process forms trenches in unprotected regions through the photoresist, through the stacks 105 and 107, and into the substrate 100 and the SiGe layer 104. The remaining portions of the stacks 105 and 107 can serve as fin elements 110A and 110B that include the semiconductor layers 106 and 108. In some embodiments, the patterns in photoresist are controlled so as to result in a desired width of the fin elements 110A and 110B. The width may be chosen based on device performance considerations. In some embodiments, the first fin element 110A is a portion of a P-type metal-oxide semiconductor (PFET) device, and the second fin element 110B is a portion of an N-type metal-oxide semiconductor (NFET) device. As illustrated in FIG. 8, the first fin element 110A extends upwardly from the PFET region 101 of the substrate 100, and the second fin element 110B extends upwardly from the NFET region 103 of the substrate 100.

FIG. 8 also illustrates isolation regions 109 between the first and second fin elements 110A and 110B. An exemplary formation of the isolation regions 109 includes depositing a dielectric material, such as silicon oxide, into the trenches between the fin elements 110A and 110B to form isolation regions 109, planarizing the isolation regions 109 by using, for example, a chemical mechanical planarization (CMP) operation, and then recessing the isolation regions 109, such that the isolation regions 109 have top surfaces in positions lower than top surfaces of the fin elements 110A and 110B. In some embodiments, the recessing the isolation regions 109 may include a dry etching process, a wet etching process, and/or a combination thereof. In some embodiments, a recessing depth is controlled (e.g., by controlling an etching time) so as to result in a desired height of portions of the fin elements 110A and 110B protruding above the isolation regions 109. The height may be chosen based on device performance considerations.

Referring to FIG. 9, the second semiconductor layers 108 in the PFET region 101 and the first semiconductor layers 106 in the NFET region 103 are removed using suitable etch techniques. For example, the second semiconductor layers 108 in the PFET region 101 are removed by using a first etching process, and the first semiconductor layers 106 in the NFET region 103 are removed by using a second etching process different from the first etching process. In some embodiments, an etch rate of silicon is greater than an etch rate of silicon germanium during the first etching process, so that the silicon layers 108 in the PFET region 101 are selectively removed. On the contrary, an etch rate of silicon germanium is greater than an etch rate of silicon during the second etching process, so that the silicon germanium layers 106 in the NFET region 103 are selectively removed. In some embodiments, the etchant used in the second etching process may include $Cl_2$, $NF_3$ and He mixture, an alkali solution (for example, such as $NH_4OH$ or TMAH), $F_2/NH_3$ mixture, $SF_6$, $CH_3F$ or other etchant which provides comparable etch rate than the etchant used in the first etching process. In other embodiments, the etchant used in the second etching process may include halogen and/or composition used for passivation. In some embodiments, the second etching process may be performed at temperature below about 100° C. Embodiments of the present disclosure may employ a patterned mask to protect a region (e.g. NFET region 103) when certain semiconductor layers in another region (e.g. PFET region 101) are to be removed.

In the following discussion, the remaining semiconductor layers 106 of the fin elements 110A are referred to as first nanowires 116A. In some embodiments, as shown in FIG. 9, the nanowires 116A have a cross-sectional profile of a rectangle and are suspended. Gaps 117A are formed between adjacent nanowires 116A. In addition, immediately adjacent nanowires 116A are spaced-apart by a substantially equal distance.

In the following discussion, the remaining semiconductor layers 108 of the fin elements 110B in the NFET region 103 are referred to as the nanowires 116B. In some embodiments, as shown in FIG. 9, nanowires 116B have a cross-sectional profile of a rectangle and are suspended. Immediately adjacent nanowires 116B may be spaced-apart by gaps 117B formed between adjacent nanowires 116B. In addition, immediately adjacent nanowires 116B are spaced-apart by a substantially equal distance.

The nanowires 116A in the PFET region 101 are aligned with the nanowires 116B in the NFET region 103, as shown in FIG. 9, which in turn will reduce potential loading effects in subsequent processes (e.g. formation of gate stacks). In some embodiments, the bottommost nanowire 116A in the PFET region 101 is suspended. In other words, the bottom surface of the bottommost nanowire 116A is separated from the underlying material. That is, the bottommost nanowire 116A is not in physical contact with the substrate 100. In some embodiments, the bottommost nanowire 116B in the NFET region 103 is suspended as well. In other words, the bottommost nanowire 116B is not in physical contact with the SiGe layer 104. Such suspended nanowires in PFET and NFET regions 101 and 103 are advantageous for improving device performance, which will be discussed below.

In some embodiments, as shown in FIG. 9, the nanowires 116A and 116B have a profile of the same shape (e.g., rectangle in cross section). Alternatively, in some embodiments, the nanowires 116A and 116B may have profiles of different shapes. In some embodiments, the etching conditions of the etching process may be controlled so that the nanowires 116A and 116B have desired nanowire widths and desired nanowire heights, and adjacent nanowires 116A, 116B have desired spacing distances. The various desired dimensions and shapes may be chosen based on device performance considerations.

Next, a first gate stack 122A is formed around each first nanowires 116A, and a second gate stack 122B is formed around each second nanowire 116B. The gate stacks are formed around a central portion of the nanowires that is channel regions of the nanowires. The gate stack 122A includes a gate dielectric layer 118A formed around nanowires 116A and a gate electrode layer 120A formed around the gate dielectric layer 118A, in some embodiments. The gate stack 122B includes a gate dielectric layer 118B formed around nanowires 116B and a gate electrode layer 120B formed around the gate dielectric layer 118B, in some embodiments.

In certain embodiments, at least one of the gate dielectric layers 118A and 118B includes one or more layers of a dielectric material, such as silicon oxide, silicon nitride, high-k dielectric material, other suitable dielectric material, and any combination thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, or any combination thereof. In some embodiments, the gate dielectric layer includes an interfacial layer (not shown) formed between the nanowires and the dielectric material. The gate dielectric layer may be formed by CVD, ALD, or any suitable method. In one embodiment, the gate dielectric layer is formed using a highly conformal deposition process such as ALD in order to ensure the formation of a gate dielectric layer having a uniform thickness around each nanowire.

At least one of the gate electrode layers 120A and 120B includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, or any combination thereof. The gate electrode layer may be formed by CVD, ALD, electroplating, or other suitable method. In some embodiments, the gate electrode layers 120A and 120B are formed of different metals, so that the gate electrode layer 120A can provide suitable work function for the PFET device, and the gate electrode layer 120B can provide suitable work function for the NFET device.

In some embodiments, insulating sidewalls 119 are formed on opposing sides of the gate electrode layers 120A and 120B, and first source/drain layers 115A are formed on peripheral portions of the nanowires 116A and on opposing sides of the gate stack 122A. The insulating sidewall 119 is between the gate stack 122A and the source/drain layer 115A, as shown in FIG. 11, which corresponds to a cross section according to line B-B of FIG. 1 of the first nanowire structure 124A. Similarly, second source/drain layers 115B are formed on peripheral portions of the nanowires 116B and on opposing sides of the gate stack 122B. The insulating sidewall 119 is between the gate stack 122B and the source/ drain layer 115B, as shown in FIG. 12, which corresponds to a cross section according to line C-C of FIG. 1 of the second nanowire structure 124B.

By way of example, the material for the source/drain layers 115A includes one or more layers of Ge or SiGe suitable for the PFET device, and material for the source/drain layers 115B includes one or more layers of Si, SiP, or SiC suitable for the NFET device. The source/drain layers 115A and 115B are formed by an epitaxial growth method using CVD, ALD, or molecular beam epitaxy (MBE). During formation of source/drain layer 115A for the PFET device, the second nanowires 116B in the NFET region 103 are covered by a patterned mask. During formation of the source/drain layer 115B for the NFET device, the first nanowires 116A of the PFET device is covered by another patterned mask.

In order to support the nanowires during processing, the peripheral portions of the nanowires where the source/drain layers 115A and 115B are formed may be masked during the removal of either the first and second semiconductor layers 106 and 108 from the central portions of the nanowires where the gate stacks 122A and 122B are to be formed. After formation of the gate stacks 122A and 122B, the central portion of the nanowires where the gate stacks 122A and 122B are formed may be masked, and the respective first and second semiconductor layers 106 and 108 are removed from the peripheral portions of the nanowire where the source/drain layers 115A and 115B are formed.

Alternatively, in some embodiments dummy gate structures are initially formed on the first and second fin elements 110A and 110B (see FIG. 8), and the respective first and second semiconductor layers 106 and 108 are removed from the peripheral portions of the nanowire where the source/drain layers 115A and 115B are formed. After forming the source/drain layers 115A and 115B, the dummy gate electrode structures are removed, followed by formation of gate stacks 122A and 122B according to the present disclosure.

Figure 13:
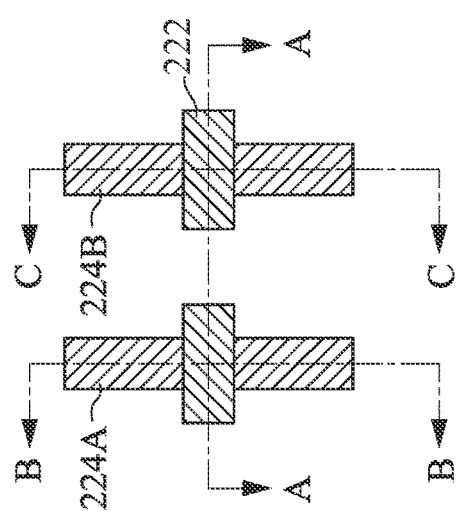
FIG. 13 is a plan view of some embodiments of a GAA FET device according to the present disclosure.

FIG. 13 is a plan view of some embodiments of a GAA FET device according to the present disclosure. FIGS. 14-24 show exemplary sequential processes for manufacturing GAA FET devices according to embodiments of the present disclosure. It is understood that additional operations can be provided before, during, and after processes shown by FIGS. 14-24, and some of the operations described below can be replaced or eliminated, for certain embodiments of the method. The order of the operations/processes may be interchangeable.

Figure 14:
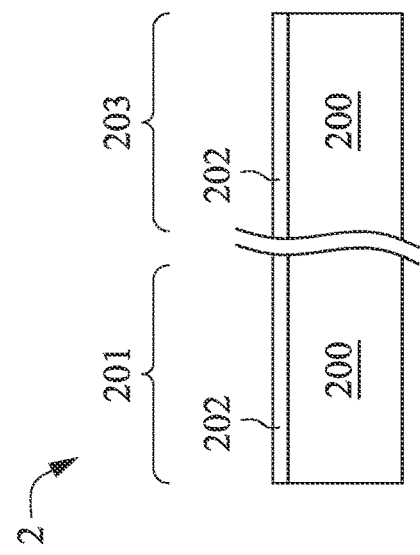

A plan view of a GAA FET device is illustrated in FIG. 13. As shown in FIG. 13, gate stacks 222 are formed overlying first and second nanowire structures 224A and 224B, each of which includes one or more nanowires. Although two nanowire structures and two gate stacks are shown in FIG. 13, GAA FET devices according to the present disclosure may include one, three, or more nanowire structures and one, three, or more gate stacks. Referring to FIG. 14, a device 2 comprising a substrate 200 is provided. The substrate 200 may be semiconductor substrate, which may be, for example, a silicon substrate, a silicon germanium substrate, or a substrate formed of other semiconductor materials. In some embodiments, substrate 200 is a bulk substrate. Alternatively, the substrate 200 may be a semiconductor-on-insulator (SOI) substrate. Hard mask 202 is formed over the substrate 200. In accordance with some embodiments of the present disclosure, the hard mask 202 is formed of silicon nitride, silicon oxynitride, silicon carbide, silicon carbo-nitride, the like, or combinations thereof.

Figure 16:
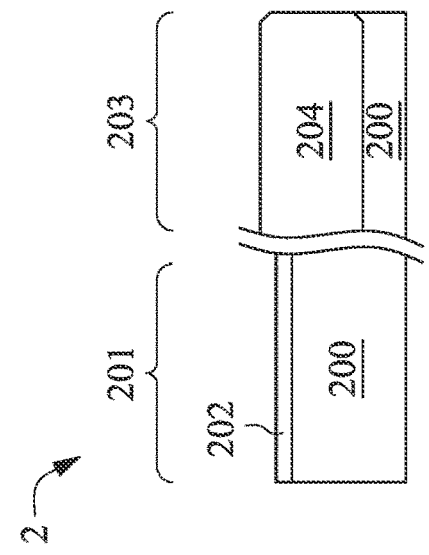

As shown in FIG. 14, the substrate 200 comprises a PFET region 201 and an NFET region 203. Next, as shown in FIG. 15, the hard mask 202 and the substrate 200 are patterned and etched to form a recess P2 over the NFET region 203. Therefore, a top surface of the NFET region 203 is lower than that of the PFET region 201. In some embodiments, a silicon germanium (SiGe) layer 204 is formed on the substrate 200 in the NFET region 203 to fill the recess P2, as shown in FIG. 16. The silicon germanium layer 204 is different from the material of the substrate 200. For example, the substrate 200 is formed of silicon, rather than silicon germanium. The formation of the SiGe layer 204 may be performed by a molecular beam epitaxy (MBE) process, a metalorganic chemical vapor deposition (MOCVD) process, and/or other suitable growth processes.

Figure 17:
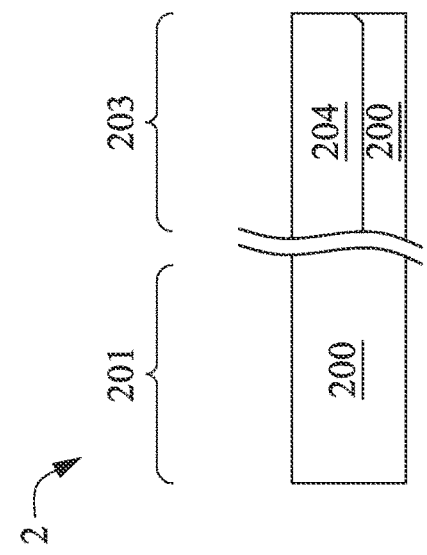

After the formation of the SiGe layer 204, an optional planarization operation, such as a chemical mechanical planarization (CMP) operation, may be performed to the substrate 200, thinning down the SiGe layer 204 overlying the substrate 200 in the NFET region 203. The resulting structure is illustrated in FIG. 17. A top surface of the SiGe layer 204 is substantially level with a top surface of the substrate 200 in the PFET region 201.

Figure 18:
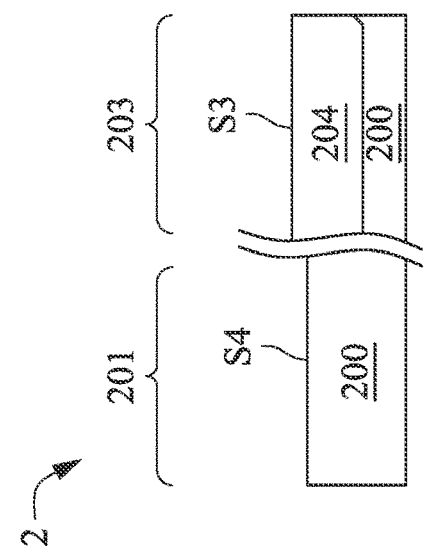

After the planarization operation performed to the SiGe layer 204, an etch-back operation is performed to recess the Si substrate 200 in the PFET region 201 before the subsequent epitaxial growth process, thereby forming a lowered top surface S4 in lower elevation than a top surface S3 of the SiGe layer 204 in the NFET region 203. The resulting structure is shown in FIG. 18. The recessing process may include a dry etching process, a wet etching process, and/or a combination thereof. Conditions of the recessing process are selected to form such surfaces S3 and S4 as shown in FIG. 18. For example, the etch-back operation may be a plasma process using $CF_4$, $CF_2Cl_2$, $CF_3Br$, HBr, chlorine as process gases and an inert gas, such as He, Ne, Ar, Kr, Xe and Rn and combinations thereof as a carrier gas, to anisotropically etch the SiGe layer 204. In some embodiments, the etch-back operation comprises adopting an etchant having a selectivity between Si and SiGe, such that an etch rate of Si is higher than an etch rate of SiGe during this etch-back operation.

Referring to FIG. 18, in some embodiments, a recessing depth is controlled (e.g., by controlling an etching time) so as to result in a desired height difference between the top surface S3 of the SiGe layer 204 and the top surface S4 of the substrate 200 in the PFET region 201. The height difference between the top surfaces S3 and S4 may be chosen based on heights of nanowires subsequently formed in the PFET region 201 and the NFET region 203. In some embodiments, the height difference between the top surfaces S3 and S4 ranges from about 4 nm to about 10 nm. Such a height difference contributes to alignment of subsequently formed Si nanowires in the NFET region 203 with SiGe nanowires in the PFET region 201.

A stack including semiconductor layers are formed over the substrate. For example, referring to FIG. 19, a first stack 205 and a second stack 207 of semiconductor layers are formed over the substrate 200 in the PFET region 201 and the NFET region 203 respectively. The first stack 205 and second stack 207 of semiconductor layers may include alternating layers of different compositions. For example, in some embodiments, the first and second stacks 205 and 207 include first semiconductor layers 206 of a first composition alternating with second semiconductor layers 208 of a second composition different from the first composition. Although five first semiconductor layers 206 and five second semiconductor layers 208 are shown, it is understood that the first and second stacks 205 and 207 may include any number of layers of any suitable composition with various examples including between 2 and 10 first semiconductor layer 206 and between 2 and 10 second semiconductor layers 208. As explained below, the different compositions of the layers in the first and second stacks 205 and 207 (e.g., first semiconductor layers 206 and second semiconductor layers 208) may be used to selectively process some of the layers. Accordingly, the compositions may have different oxidation rates, etchant sensitivity, and/or other differing properties.

In some embodiments, either of the semiconductor layers 206 and 208 may include silicon. In some embodiments, either of the semiconductor layers 206 and 208 may include other materials such as Ge, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In some embodiments, the semiconductor layer 206 may include from about 10% to about 70% Ge in molar ratio and the semiconductor layer 208 may include Si. In other embodiments, the semiconductor layer 206 may include Si and the semiconductor layer 208 may include from about 10% to about 70% Ge in molar ratio. In some embodiments, the semiconductor layers 106 and 108 may be undoped or substantially dopant-free (i.e., having an extrinsic dopant concentration from about 0 $cm^{-3}$ to about $1\times10^{17}$ $cm^{-3}$), where for example, no doping is performed during the epitaxial growth process. Alternatively, the semiconductor layers 208 may be doped as discussed previously. In the depicted embodiments, the first semiconductor layers 206 are SiGe layers, and the second semiconductor layers 208 are Si layers.

The thickness of first and second semiconductor layers 206 and 208 are formed based on the height difference between the top surfaces S3 and S4. For example, the thickness of either the semiconductor layer 206 or the semiconductor layer 208 is substantially equal to the height difference between the top surfaces S3 and S4. By way of example, the thickness of the first semiconductor layer 206 is in a range from about 4 nm to about 10 nm. In some embodiments, the first semiconductor layers 206 of the first and second stacks 205 and 207 may be substantially uniform in thickness. In some embodiments, the thickness of the semiconductor layer 208 is in a range from about 4 nm to about 10 nm. In some embodiments, the second semiconductor layers 208 of the first and second stacks 205 and 207 are substantially uniform in thickness. By way of example, growth of the layers of the stacks 205 and 207 may be performed by a molecular beam epitaxy (MBE) process, a metalorganic chemical vapor deposition (MOCVD) process, and/or other suitable epitaxial growth processes. In some embodiments, the growth of the layers of the stacks 205 and 207 may be performed using process gases comprising $SiH_4$, DCS, $GeH_4$, $Si_2H_6$, $PH_3$, HCl, $GeH_4$ or MMS (carbon source) and carrier gas comprising $N_2$ or $H_2$. The epitaxial growth process may be performed under process temperature in a range from about 400° C. to about 800° C. and under process pressure below about 50 torr, as example.

Figure 19:
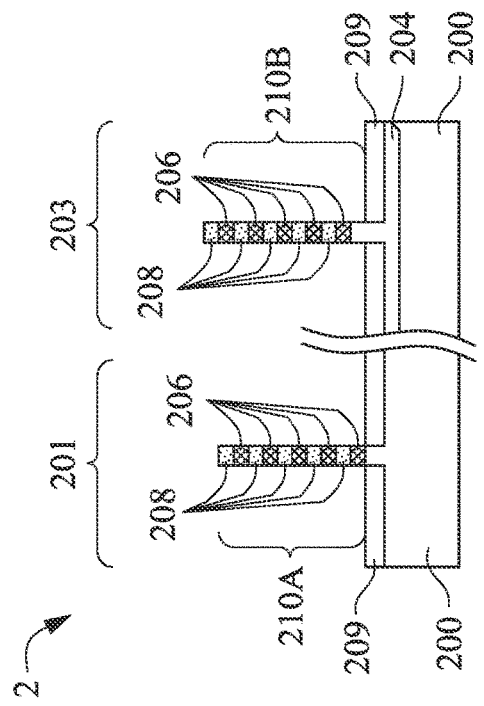

Referring again to FIG. 19, the stacks 205 and 207 are grown using a single epitaxial process. In other words, the stacks 205 and 207 are epitaxially grown simultaneously over the substrate 200 and the SiGe layer 204. Since the height difference between the top surfaces S3 and S4 is equal to the thickness of either the first semiconductor layer 206 or the second semiconductor layer 208, a bottommost semiconductor layer 206 in the PFET region 201 has a top surface substantially level with the top surface S3 of the SiGe layer 204 in the NFET region 203. Therefore, other first semiconductor layers 206 in the PFET region 201 are aligned with the respective second semiconductor layers 208 in the NFET region 203. Meanwhile, the second semiconductor layers 208 in the PFET region 201 are aligned with the respective first semiconductor layers 206 in the NFET region 203. In some embodiments, a bottommost semiconductor layer 206 overlying the substrate 200 in the PFET region 201 is at a height lower than a bottommost semiconductor layer 206 overlying the SiGe layer 204 in the NFET region 203, as shown in FIG. 19. Therefore, a top surface of the first stack 205 is at a height lower than a top surface of the second stack 207. In detail, a height difference between a top surface of the stack 205 and a top surface of the stack 207 is substantially equal to the height difference between the top surfaces S3 and S4. In other words, the semiconductor layer 208 overlying the substrate 200 in the PFET region 201 is at a height lower than the semiconductor layer 208 overlying the SiGe layer 204 in the NFET region 203.

Figure 20:
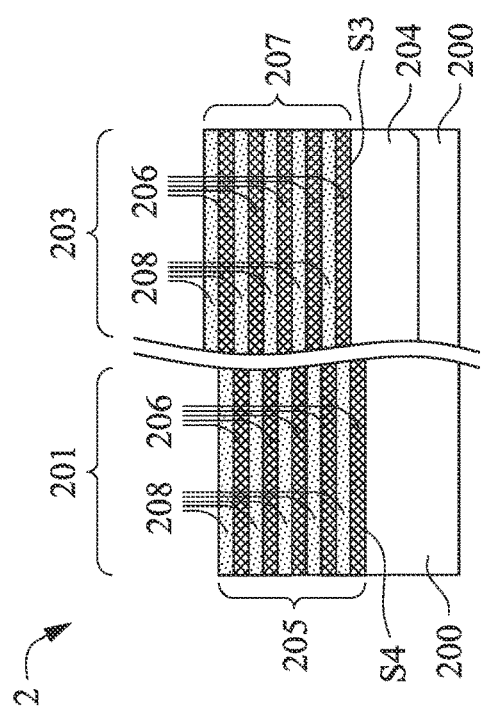

Next, referring to FIG. 20, first and second fin elements 210A and 210B are formed over the PFET region 201 and the NFET region 203 using suitable processes including photolithography and etch processes. In some embodiments, a photoresist is formed over the first and second stacks 205 and 207 (as shown in FIG. 19) and patterned using a lithography process. The patterned photoresist may then be used to protect regions of the substrate 200 and the SiGe layer 204, and layers formed thereupon, while an etch process forms trenches in unprotected regions through the photoresist, through the stacks 205 and 207, and into the substrate 200 and the SiGe layer 204. The remaining portions of the stacks 205 and 207 can serve as fin elements 210A and 210B that include the semiconductor layers 206 and 208. In some embodiments, the patterns in photoresist are controlled so as to result in a desired width of the fin elements 210A and 210B. The width may be chosen based on device performance considerations. In some embodiments, the first fin element 210A is a portion of P-type metal-oxide semiconductor (PFET) elements, and second fin element 210B is a portion of N-type metal-oxide semiconductor (NFET) elements. As illustrated in FIG. 20, the first fin element 210A extends from the PFET region 201 of the substrate 200, and the second fin element 210B extends from the NFET region 203 of the substrate 200.

Isolation regions 209 are formed, as shown in FIG. 20. For example, a dielectric material, such as silicon oxide, may be deposited into the trenches between the fin elements 210A and 210B to form isolation regions 209. A chemical mechanical planarization (CMP) operation may be performed to planarize a top surface of the isolation regions 209, and then the isolation regions 209 are recessed, thereby leaving the fin elements 210A and 210B extending above the isolation regions 209. In some embodiments, the recessing process may include a dry etching process, a wet etching process, and/or a combination thereof. In some embodiments, a recessing depth is controlled (e.g., by controlling an etching time) so as to result in a desired height of portions of the fin elements 210A and 210B protruding above the isolation regions 209. The height may be chosen based on device performance considerations.

Figure 21:
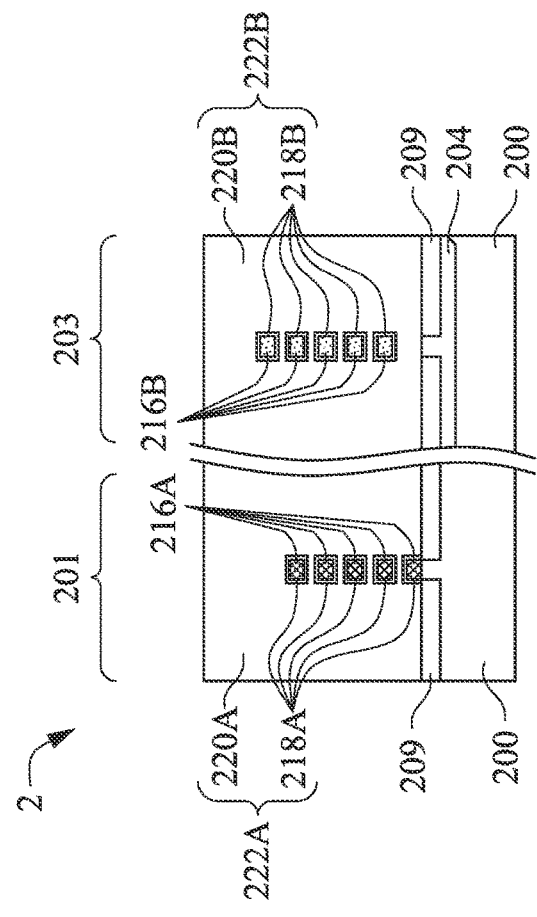
Figure 22:
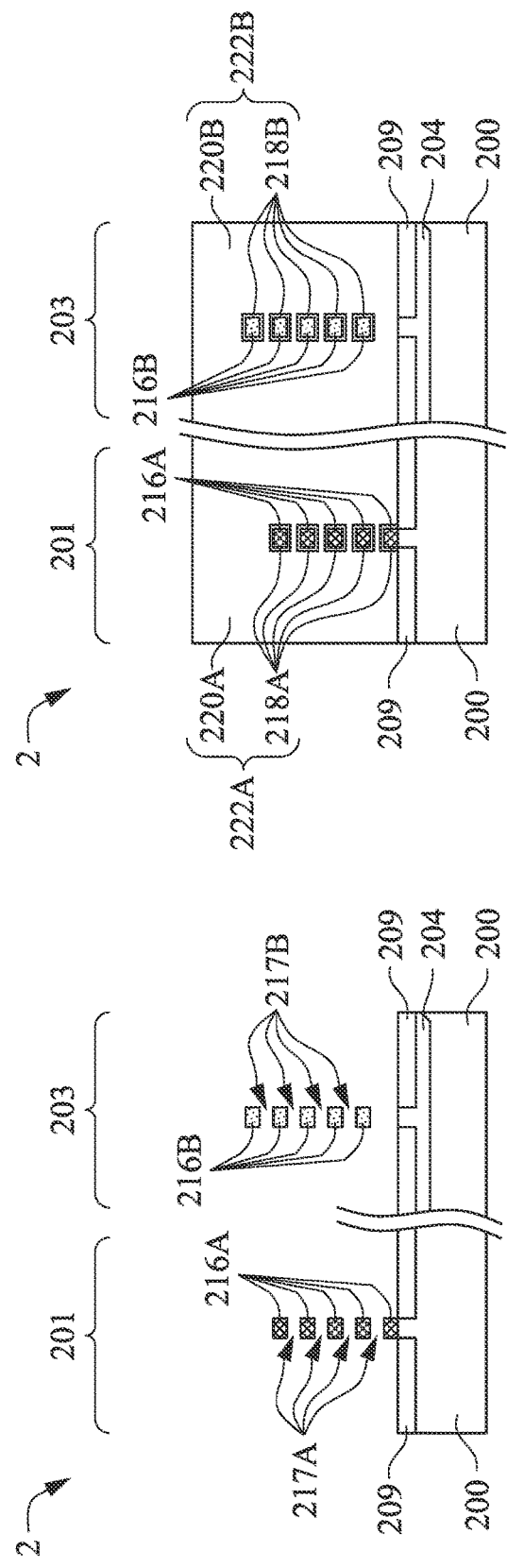

Referring to FIG. 21, the second semiconductor layers 108 in the PFET region 201 and the first semiconductor layers 206 in the NFET region 203 are removed using suitable etch techniques. For example, the second semiconductor layers 208 in the PFET region 201 are removed by using a first etching process, and the first semiconductor layers 206 in the NFET region 203 are removed by using a second etching process different from the first etching process. In some embodiments, an etch rate of silicon is greater than an etch rate of silicon germanium during the first etching process, so that the silicon layers 208 in the PFET region 201 are selectively removed. On the contrary, an etch rate of silicon germanium is greater than an etch rate of silicon during the second etching process, so that the silicon germanium layers 206 in the NFET region 203 are selectively removed. Embodiments of the present disclosure may employ a patterned mask to protect a region (e.g. NFET region 203) when certain semiconductor layers in another region (e.g. PFET region 201) are to be removed.

In the following discussion, the remaining semiconductor layers 206 of the fin elements 210A are referred to as first nanowires 216A. In some embodiments, as shown in FIG. 21, the nanowires 216A have a cross-sectional profile of a rectangle and are suspended. Gaps 217A are formed between adjacent nanowires 216A. In addition, immediately adjacent nanowires 216A are spaced-apart by a substantially equal distance.

In the following discussion, the remaining semiconductor layers 2108 of the fin elements 210B in the NFET region 203 are referred to as the nanowires 216B. In some embodiments, as shown in FIG. 21, nanowires 216B have a cross-sectional profile of a rectangle and are suspended. Immediately adjacent nanowires 216B may be spaced-apart by gaps 217B formed between adjacent nanowires 216B. In addition, immediately adjacent nanowires 216B are spaced-apart by a substantially equal distance. The nanowires 216A in the PFET region 201 are aligned with the nanowires 216B in the NFET region 203, as shown in FIG. 21, which in turn will reduce potential loading effects in subsequent processes (e.g. formation of gate stacks).

Next, a first gate stack 222A is formed around each first nanowires 216A, and a second gate stack 222B is formed around each second nanowire 216B. The gate stacks are formed around a central portion of the nanowires that is channel regions of the nanowires. The gate stack 222A includes a gate dielectric layer 218A formed around nanowires 216A and a gate electrode layer 220A formed around the gate dielectric layer 218A, in some embodiments. The gate stack 222B includes a gate dielectric layer 218B formed around nanowires 216B and a gate electrode layer 220B formed around the gate dielectric layer 218B, in some embodiments.

In certain embodiments, at least one of the gate dielectric layers 218A and 218B includes one or more layers of a dielectric material, as discussed with respect to the gate dielectric layers 118A and 118B. At least one of the gate electrode layers 220A and 220B includes one or more layers of conductive material, as discussed with respect to the gate electrode layer 120A and 120B.

In some embodiments, insulating sidewalls 219 are formed on opposing sides of the gate stacks 222A and 222B, and first source/drain layers 215A are formed on peripheral portions of the nanowires 216A and on opposing sides of the gate stack 222A. The insulating sidewall 119 is between the gate stack 222A and the source/drain layer 215A, as shown in FIG. 23, which corresponds to a cross section according to line B-B of FIG. 13 of the first nanowire structure 224A. Similarly, second source/drain layers 215B are formed on peripheral portions of the nanowires 216B and on opposing sides of the gate stack 222B. The insulating sidewall 119 is between the gate electrode layer 220B and the source/drain layer 215B, as shown in FIG. 24, which corresponds to a cross section according to line C-C of FIG. 13 of the second nanowire structure 224B.

By way of example, the material for the source/drain layers 215A includes one or more layers of Ge or SiGe suitable for the PFET device, and material for the source/drain layers 215B includes one or more layers of Si, SiP, or SiC suitable for the NFET device. The source/drain layers 215A and 215B are formed by an epitaxial growth method using CVD, ALD, or molecular beam epitaxy (MBE). During formation of the source/drain layer 215A for the PFET device, the second nanowires 216B in the NFET region 203 are covered by a patterned mask. During formation of the source/drain layer 215B for the NFET device, the first nanowires 216A of the PFET device are covered by another patterned mask.

In order to support the nanowires during processing, the peripheral portions of the nanowires where the source/drain layers 215A and 215B are formed may be masked during the removal of either the first and second semiconductor layers 206 and 208 from the central portions of the nanowires where the gate stacks 222A and 222B are to be formed. After formation of the gate stacks 222A and 222B, the central portion of the nanowires where the gate stacks 222A and 222B are formed may be masked, and the respective first and second semiconductor layers 206 and 208 are removed from the peripheral portions of the nanowire where the source/drain layers 215A and 215B are formed.

Alternatively, in some embodiments dummy gate structures are initially formed on the first and second fin elements 210A and 210B (see FIG. 20), and the respective first and second semiconductor layers 206 and 208 are removed from the peripheral portions of the nanowire where the source/drain layers 215A and 215B are formed. After forming the source/drain layers 215A and 215B, the dummy gate electrode structures are removed, followed by formation of gate stacks 222A and 222B according to the present disclosure.

Figure 25:
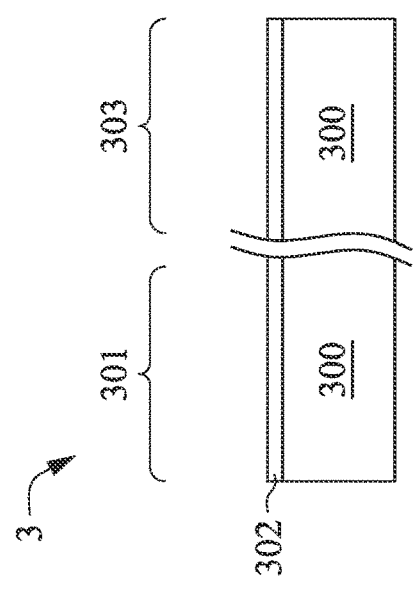
FIG. 25 is a plan view of some embodiments of a GAA FET device according to the present disclosure.

FIG. 25 is a plan view of some embodiments of a GAA FET device according to the present disclosure. FIGS. 26-35 show exemplary sequential processes for manufacturing GAA FET devices according to embodiments of the present disclosure. It is understood that additional operations can be provided before, during, and after processes shown by FIGS. 26-35, and some of the operations described below can be replaced or eliminated, for certain embodiments of the method. The order of the operations/processes may be interchangeable.

Figure 26:
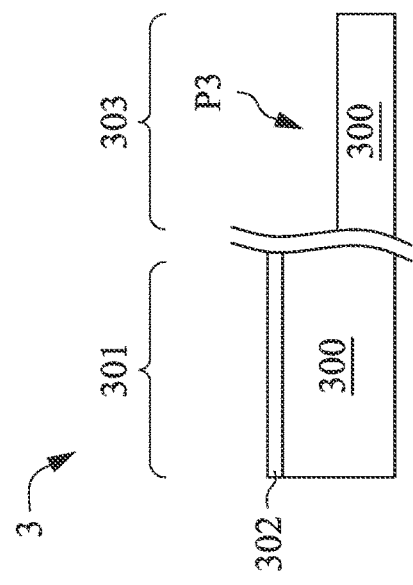
FIGS. 26-33 are cross-sectional views corresponding to line A-A of FIG. 25 and show a sequential process for manufacturing a GAA FET device according to some embodiments of the present disclosure.

A plan view of a GAA FET device is illustrated in FIG. 25. As shown in FIG. 25, gate stacks 318 are formed overlying first and second nanowire structures 324A and 324B, each of which includes one or more nanowires. Although two nanowire structures and two gate stacks are shown in FIG. 25, GAA FET devices according to the present disclosure may include one, three, or more nanowire structures and one, three, or more gate stacks. Referring to FIG. 26, a device 3 comprising a substrate 300 is provided. The substrate 300 may be semiconductor substrate, as previously discussed with respect to the substrate 100 or 200. Hard mask 302 is formed over the substrate. In accordance with some embodiments of the present disclosure, the hard mask 302 is formed of silicon nitride, silicon oxynitride, silicon carbide, silicon carbo-nitride, the like, or combinations thereof.

Figure 27:
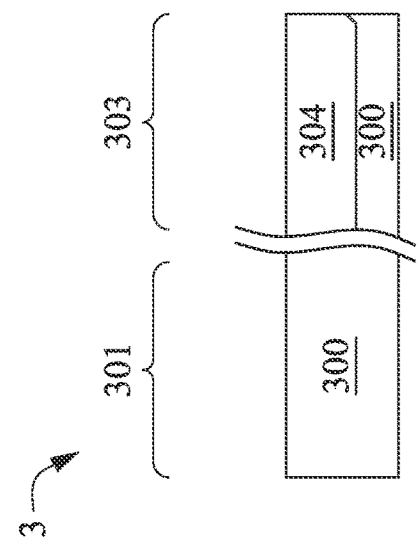

As shown in FIG. 26, the substrate 300 comprises a PFET region 301 and a NFET region 303. Next, as shown in FIG. 27, the hard mask 302 and the substrate 300 are patterned and etched to form a recess P3 over the NFET region 303.

Figure 28:
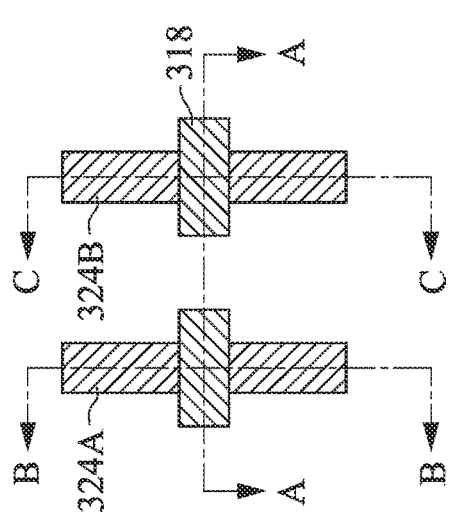

Therefore, a top surface of the NFET region 303 is lower than that of the PFET region 301. In some embodiments, a silicon germanium (SiGe) layer 304 is formed on the substrate 300 in the NFET region 303 to fill the recess P3, as shown in FIG. 28. The silicon germanium layer 304 is different from the material of the substrate 300. For example, the substrate 300 is formed of silicon, rather than silicon germanium. The formation of the SiGe layer 304 may be performed by a molecular beam epitaxy (MBE) process, a metalorganic chemical vapor deposition (MOCVD) process, and/or other suitable growth processes.

Figure 29:
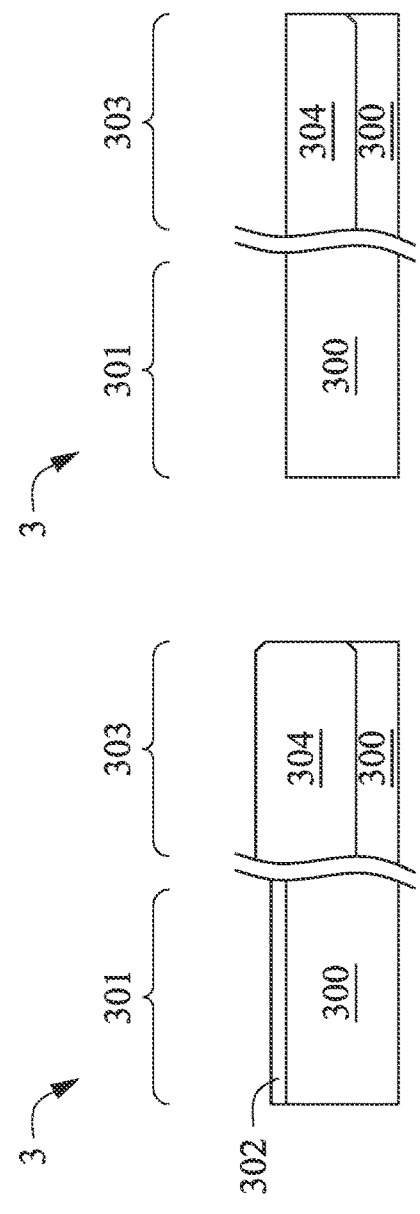

After the formation of the SiGe layer 304, a planarization operation, such as a chemical mechanical planarization (CMP) operation, may be performed to the substrate 300, partially removing the SiGe layer 304 overlying the substrate 300 in the NFET region 303. The resulting structure is illustrated in FIG. 29. A top surface of the SiGe layer 304 is substantially level with a top surface of the substrate 300 in the PFET region 301.

A stack including semiconductor layers are formed over the substrate. For example, referring to FIG. 30, a first stack 305 and a second stack 307 of semiconductor layers are formed over the substrate 300 in the PFET region 301 and the NFET region 303 respectively. The first stack 305 and stack 307 of semiconductor layers may include alternating layers of different compositions. For example, in some embodiments, the first and second stacks 305 and 307 include first semiconductor layers 306 of a first composition alternating with second semiconductor layers 308 of a second composition different from the first composition. By way of example, the first semiconductor layer 306 is made of SiGe, and the second semiconductor layer 308 is made of Si. In some embodiments where the substrate 300 is silicon and the semiconductor layer 306 is made of SiGe, epitaxy conditions of forming a bottommost SiGe layer 306 can be controlled such an incubation time of epitaxially growing SiGe on Si (i.e. heteroepitaxial growth) is longer than an incubation time of epitaxially growing SiGe on SiGe (i.e. homoepitaxial growth). In some embodiments, the formation of the bottommost SiGe layer 306 may be performed at a temperature below about 600° C. to result in incubation time difference between growing the SiGe on SiGe and growing SiGe on Si. As a result, a portion of the bottommost SiGe layer 306 grown on silicon in the PFET region 301 is thinner than a portion of the bottommost SiGe layer 306 grown on silicon germanium in the NFET region 303. Such a thickness difference contributes to alignment of subsequently formed Si nanowires in the NFET region 303 with SiGe nanowires in the PFET region 301.

By way of example, a thickness difference between the portion of the bottommost SiGe layer 306 in the PFET region 301 and that in the NFET region 303 is substantially equal to a thickness of each overlying semiconductor layers 306 and 308, which in turn will improve the alignment of nanowires in the PFET region 301 with nanowires in NFET region 303. For example, the thickness difference between the portion of the bottommost SiGe layer 306 in the PFET region 301 and that in the NFET region 303 is in a range from about 4 nm to about 10 nm.

Figure 30:
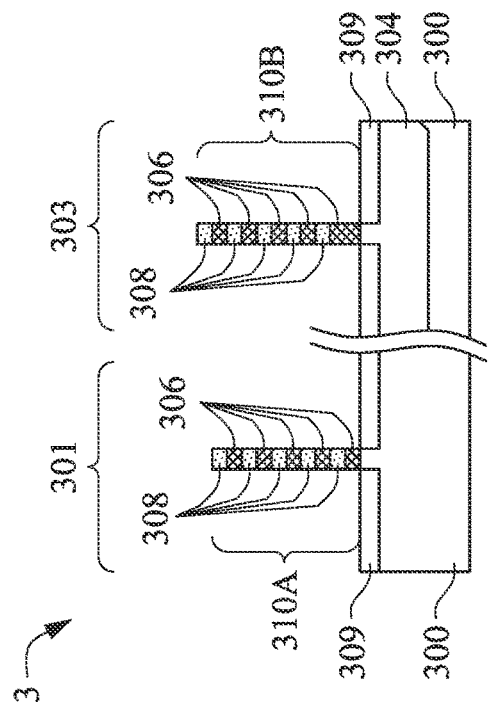
Figure 31:
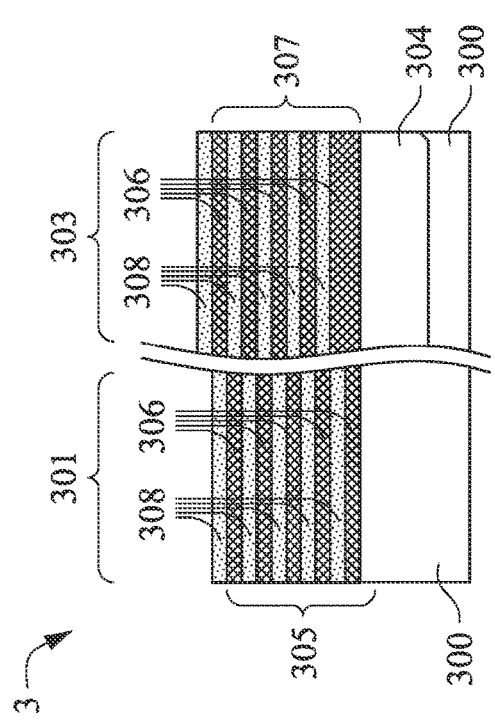

Referring to FIG. 31, first and second fin elements 310A and 310B are formed over the PFET region 301 and the NFET region 303 using suitable processes including photolithography and etch processes. In some embodiments, a photoresist is formed over the first and second stacks 305 and 307 (as shown in FIG. 30) and patterned using a lithography process. The patterned photoresist may then be used to protect regions of the substrate 300 and the SiGe layer 304, and layers formed thereupon, while an etch process forms trenches in unprotected regions through the photoresist, through the stacks 305 and 307, and into the substrate 300 and the SiGe layer 304. The remaining portions of the stacks 305 and 307 can serve as fin elements 310A and 310B that include the semiconductor layers 306 and 308. In some embodiments, the patterns in photoresist are controlled so as to result in a desired width of the fin elements 310A and 310B. The width may be chosen based on device performance considerations. In some embodiments, the first fin element 310A is a portion of P-type metal-oxide semiconductor (PFET) devices, and the second fin element 310B is a portion of N-type metal-oxide semiconductor (NFET) devices. As illustrated in FIG. 31, the first fin element 310A extends upwardly from the PFET region 301, and the second fin element 310B extends upwardly from the PFET region 301.

Isolation regions 309 are formed, as shown in FIG. 31. A dielectric material, such as silicon oxide, may be deposited into the trenches between the fin elements to form isolation regions 309. A chemical mechanical planarization (CMP) operation may be performed to planarize a top surface of the isolation regions 309, and then the isolation regions 309 are recessed, thereby leaving the fin elements 310A and 310B extending above the isolation regions 309.

Figure 32:
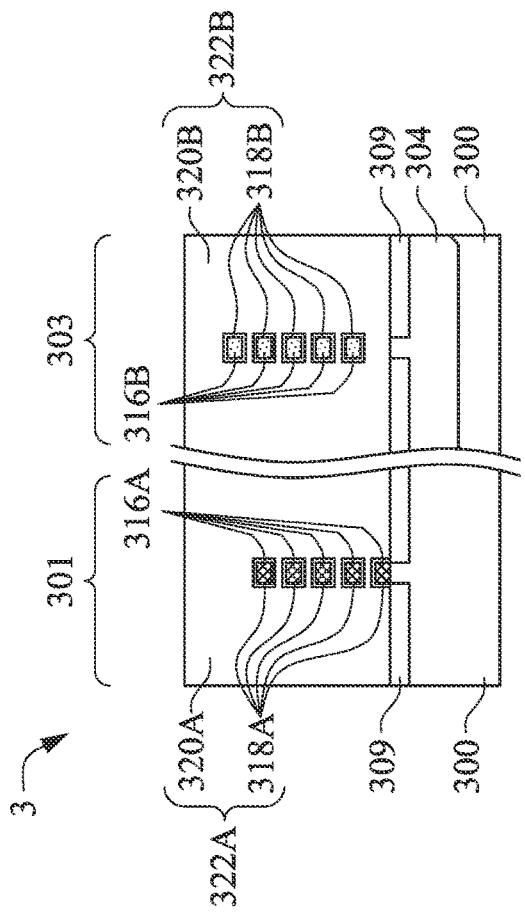
Figure 33:
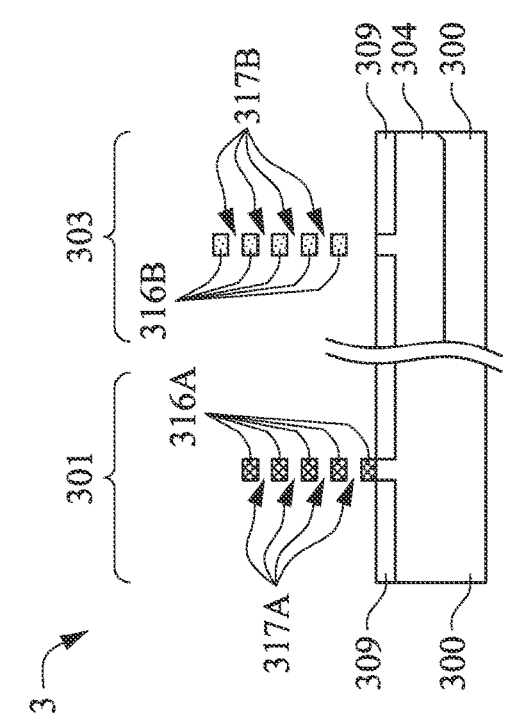

Referring to FIG. 32, the second semiconductor layers 308 in the PFET region 301 and the first semiconductor layers 306 in the NFET region 303 are removed using suitable etch techniques. For example, the second semiconductor layers 308 in the PFET region 301 are removed by using a first etching process, and the first semiconductor layers 306 in the NFET region 303 are removed by using a second etching process different from the first etching process. In some embodiments, an etch rate of silicon is greater than an etch rate of silicon germanium during the first etching process, so that the silicon layers 308 in the PFET region 301 are selectively removed. On the contrary, an etch rate of silicon germanium is greater than an etch rate of silicon during the second etching process, so that the silicon germanium layers 306 in the NFET region 303 are selectively removed. Embodiments of the present disclosure may employ a patterned mask to protect a region (e.g. NFET region 303) when certain semiconductor layers in another region (e.g. PFET region 301) are to be removed.

In the following discussion, the remaining semiconductor layers 306 of the fin elements 310A are referred to as first nanowires 316A. In some embodiments, as shown in FIG. 32, the nanowires 316A have a cross-sectional profile of a rectangle and are suspended. Gaps 317A are formed between adjacent nanowires 316A. In addition, immediately adjacent nanowires 316A are spaced-apart by a substantially equal distance.

In the following discussion, the remaining semiconductor layers 308 of the fin elements 310B in the NFET region 303 are referred to as the nanowires 316B. In some embodiments, as shown in FIG. 32, nanowires 316B have a cross-sectional profile of a rectangle and are suspended. Immediately adjacent nanowires 316B may be spaced-apart by gaps 317B formed between adjacent nanowires 316B. In addition, immediately adjacent nanowires 316B are spaced-apart by a substantially equal distance. The nanowires 316A in the PFET region 301 are aligned with the nanowires 316B in the NFET region 303, as shown in FIG. 32, which in turn will reduce potential loading effects in subsequent processes (e.g. formation of gate stacks).

Next, a first gate stack 322A is formed around each first nanowires 316A, and a second gate stack 322B is formed around each second nanowire 316B. The gate stacks are formed around a central portion of the nanowires that is channel regions of the nanowires. The gate stack 322A includes a gate dielectric layer 318A formed around nanowires 316A and a gate electrode layer 320A formed around the gate dielectric layer 318A, in some embodiments. The gate stack 322B includes a gate dielectric layer 318B formed around nanowires 316B and a gate electrode layer 320B formed around the gate dielectric layer 318B, in some embodiments.

In certain embodiments, at least one of the gate dielectric layers 318A and 318B includes one or more layers of a dielectric material, as discussed with respect to the gate dielectric layers 118A and 118B. At least one of the gate electrode layers 320A and 320B includes one or more layers of conductive material, as discussed with respect to the gate electrode layer 120A and 120B.

In some embodiments, insulating sidewalls 319 are formed on opposing sides of the gate stacks 322A and 322B, and first source/drain layers 315A are formed on peripheral portions of the nanowires 316A and on opposing sides of the gate stack 322A. The insulating sidewall 319 is between the gate stack 322A and the source/drain layer 315A, as shown in FIG. 34, which corresponds to a cross section according to line B-B of FIG. 25 of the first nanowire structure 324A. Similarly, second source/drain layers 315B are formed on peripheral portions of the nanowires 316B and on opposing sides of the gate stack 322B. The insulating sidewall 319 is between the gate electrode layer 320B and the source/drain layer 315B, as shown in FIG. 35, which corresponds to a cross section according to line C-C of FIG. 25 of the second nanowire structure 324B.

By way of example, the material for the source/drain layers 315A includes one or more layers of Ge or SiGe suitable for the PFET device, and material for the source/drain layers 315B includes one or more layers of Si, SiP, or SiC suitable for the NFET device. The source/drain layers 315A and 315B are formed by an epitaxial growth method using CVD, ALD, or molecular beam epitaxy (MBE). During formation of the source/drain layer 315A for the PFET device, the second nanowires 316B in the NFET region 303 are covered by a patterned mask. During formation of the source/drain layer 315B for the NFET device, the first nanowires 316A of the PFET device are covered by another patterned mask.

In order to support the nanowires during processing, the peripheral portions of the nanowires where the source/drain layers 315A and 315B are formed may be masked during the removal of either the first and second semiconductor layers 306 and 308 from the central portions of the nanowires where the gate stacks 322A and 322B are to be formed. After formation of the gate stacks 322A and 322B, the central portion of the nanowires where the gate stacks 322A and 322B are formed may be masked, and the respective first and second semiconductor layers 306 and 308 are removed from the peripheral portions of the nanowire where the source/drain layers 315A and 315B are formed.

Alternatively, in some embodiments dummy gate structures are initially formed on the first and second fin elements 310A and 310B (see FIG. 31), and the respective first and second semiconductor layers 306 and 308 are removed from the peripheral portions of the nanowire where the source/drain layers 315A and 315B are formed. After forming the source/drain layers 315A and 315B, the dummy gate electrode structures are removed, followed by formation of gate stacks 322A and 322B according to the present disclosure.

The embodiments of the present disclosure offer advantages over existing art, although it is understood that different embodiments may offer different advantages, not all advantages are necessarily discussed herein, and that no particular advantage is required for all embodiments. By utilizing the method as discussed above, the loading effect in formation of gate stacks (e.g., gate stacks 122A, 122B, 222A, 222B, 322A and/or 322B) are reduced because nanowires in NFET region are substantially aligned with respective nanowires in PFET region.

In accordance with some embodiments, a semiconductor device is provided. The semiconductor device includes a substrate and a semiconductor layer formed over the substrate. The semiconductor device further includes a first channel layer and a second channel layer vertically stacked over the semiconductor layer and a first insulating structure interposing the first channel layer and the semiconductor layer. The semiconductor layer further includes a second insulating structure interposing the first channel layer and the second channel layer and a gate stack abutting the first channel layer and the second channel layer. In addition, the gate stack includes a first portion vertically sandwiched between the first channel layer and the semiconductor layer and a second portion vertically sandwiched between the first channel layer and the second channel layer. In addition, a first distance between two opposite edges of the first portion of the gate stack is different from a second distance between two opposite edges of the second portion of the gate stack.

In accordance with some embodiments, a semiconductor device is provided. The semiconductor device includes a substrate and a semiconductor layer formed over the substrate. The semiconductor device further includes channel layers vertically spaced apart from the semiconductor layer and a first source/drain region and a second source/drain region attached to opposite sides of the channel layers. The semiconductor layer further includes a gate stack encasing the channel layers and a first insulating structure directly under a topmost layer of the channel layers and laterally sandwiched between the first source/drain region and the gate stack. The semiconductor layer further includes a second insulating structure directly under the topmost layer of the channel layers and laterally sandwiched between the second source/drain region and the gate stack. In addition, a bottom width of the semiconductor layer is greater than a distance between the first insulating structure and the second insulating structure.

In accordance with some embodiments, a semiconductor device is provided. The semiconductor device includes a substrate and silicon-containing channel layers vertically stacked over the substrate. The semiconductor device further includes source/drain regions abutting opposite sides of the silicon-containing channel layers and a gate stack extending from a topmost layer of the silicon-containing channel layers to a bottommost layer of the silicon-containing channel layers. The semiconductor layer further includes insulating structures underneath the silicon-containing channel layers to separate the gate stack from the source/drain regions and a SiGe structure interposing the gate stack and the substrate. In addition, the SiGe structure comprises a narrow top portion and a wide bottom portion.

In accordance with some embodiments, a semiconductor device is provided. The semiconductor device includes a substrate and a semiconductor layer formed over a substrate. The semiconductor device further includes an isolation region covering the semiconductor layer and nanostructures formed over the semiconductor layer. The semiconductor layer further includes a gate stack wrapping around the nanostructures. In addition, the isolation region is interposed between the semiconductor layer and the gate stack.

In accordance with some embodiments, a semiconductor device is provided. The semiconductor device includes a substrate and a first fin element formed over a first region of the substrate. The semiconductor device further includes first nanostructures formed over the first fin element and a first gate stack wrapping around the first nanostructures. In addition, the first fin element is made of a semiconductor material, and a portion of the first gate stack is sandwiched between a bottommost one of the first nanowires and the semiconductor material of the first fin element. In accordance with some embodiments, a semiconductor device is provided.

The semiconductor device includes a substrate and a semiconductor layer formed over a first region of the substrate. The semiconductor device further includes first nanostructures formed over the semiconductor layer over the first region of the substrate and second nanostructures formed over a second region of the substrate. The semiconductor device further includes a first gate stack wrapping around the first nanostructures and a second gate stack wrapping around the second nanostructures. In addition, a portion of the first gate stack is sandwiched between the semiconductor layer and a bottommost one of the first nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a substrate;
    a semiconductor layer formed over the substrate;
    a first channel layer and a second channel layer vertically stacked over the semiconductor layer;
    a first insulating structure interposing the first channel layer and the semiconductor layer;
    a second insulating structure interposing the first channel layer and the second channel layer;
    a gate stack abutting the first channel layer and the second channel layer, wherein the gate stack comprises:
        a first portion vertically sandwiched between the first channel layer and the semiconductor layer; and
        a second portion vertically sandwiched between the first channel layer and the second channel layer,
        wherein a first distance between two opposite edges of the first portion of the gate stack is different from a second distance between two opposite edges of the second portion of the gate stack; and
    a source/drain region having a first region attached to the first insulating structure and a second region attached to the second insulating structure, wherein a third distance between two opposite edges of the first region is different from a fourth distance between two opposite edges of the second region.

2. The semiconductor structure as claimed in claim 1, wherein the first distance is greater than the second distance.

3. The semiconductor structure as claimed in claim 1, further comprising:
    an isolation region around the semiconductor layer and covering a sidewall surface of the semiconductor layer.

4. The semiconductor structure as claimed in claim 1, wherein both the first insulating structure and the second insulating structure overlap the semiconductor layer.

5. The semiconductor structure as claimed in claim 1, wherein the semiconductor layer and the channel layers are made of different materials.

6. The semiconductor structure as claimed in claim 1, wherein the first insulating structure physically contacts a top surface of the semiconductor layer.

7. The semiconductor structure as claimed in claim 1, wherein the first insulating structure is laterally sandwiched between the first source/drain region and the first portion of the gate stack, and the second insulating structure is laterally sandwiched between the second source/drain region and the second portion of the gate stack.

8. A semiconductor structure, comprising:
    a substrate;
    a semiconductor layer formed over the substrate;
    channel layers vertically spaced apart from the semiconductor layer;
    a first source/drain region and a second source/drain region attached to opposite sides of the channel layers;
    a gate stack encasing the channel layers;
    a first insulating structure directly under a topmost layer of the channel layers and laterally sandwiched between the first source/drain region and the gate stack; and
    a second insulating structure directly under the topmost layer of the channel layers and laterally sandwiched between the second source/drain region and the gate stack,
    wherein a bottom width of the semiconductor layer is greater than a distance between the first insulating structure and the second insulating structure, the semiconductor layer has a first thickness vertically under the first source/drain region and a second thickness vertically under the first insulating structure, and the first thickness is different from the second thickness.

9. The semiconductor structure as claimed in claim 8, wherein a bottom surface of the topmost layer of the channel layers physically contacts a top surface of the first insulating structure.

10. The semiconductor structure as claimed in claim 8, wherein the semiconductor layer continuously extends underneath the first source/drain region, the gate stack, and the second source/drain region.

11. The semiconductor structure as claimed in claim 8, wherein a portion of the gate stack interposes a bottommost layer of the channel layers and the semiconductor layer.

12. The semiconductor structure as claimed in claim 11, further comprising:
    a third insulating structure joins a bottom surface of the bottommost layer of the channel layers and a top surface of the semiconductor layer.

13. The semiconductor structure as claimed in claim 8, wherein the semiconductor layer and the channel layers are made of different materials.

14. The semiconductor structure as claimed in claim 13, wherein the semiconductor layer is a SiGe layer.

15. The semiconductor structure as claimed in claim 8, further comprising:
    an isolation region covering a sidewall surface of the semiconductor layer.

16. A semiconductor structure, comprising:

a substrate;

silicon-containing channel layers vertically stacked over the substrate;

source/drain regions abutting opposite sides of the silicon-containing channel layers;

a gate stack extending from a topmost layer of the silicon-containing channel layers to a bottommost layer of the silicon-containing channel layers;

insulating structures underneath the silicon-containing channel layers to separate the gate stack from the source/drain regions; and a SiGe structure interposing the gate stack and the substrate, wherein the SiGe structure comprises a narrow top portion and a wide bottom portion, wherein there is an interface between the gate stack and the SiGe structure.

17. The semiconductor structure as claimed in claim 16, wherein a topmost surface of the insulating structures is lower than a top surface of the topmost layer of the silicon-containing channel layers.

18. The semiconductor structure as claimed in claim 16, wherein the gate stack is confined by the insulating structures without vertically overlapping with the insulating structures.

19. The semiconductor structure as claimed in claim 16, further comprising:

an isolation region in physical contact with a sidewall surface of the narrow top portion of the semiconductor layer.

20. The semiconductor structure as claimed in claim 19, wherein the gate stacks further comprises:

a gate dielectric layer; and a gate electrode layer, wherein a top surface of the isolation region is lower than a bottom surface of the gate dielectric layer.

* * * * *